US011061321B1

(12) United States Patent
Cecil

(10) Patent No.: US 11,061,321 B1
(45) Date of Patent: Jul. 13, 2021

(54) OBTAINING A MASK USING A COST FUNCTION GRADIENT FROM A JACOBIAN MATRIX GENERATED FROM A PERTURBATION LOOK-UP TABLE

(71) Applicant: Synopsys, Inc., Mountain View, CA (US)

(72) Inventor: Thomas Cecil, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/900,237

(22) Filed: Jun. 12, 2020

Related U.S. Application Data

(60) Provisional application No. 62/865,481, filed on Jun. 24, 2019.

(51) Int. Cl.
| | |
|---|---|
| G03F 1/00 | (2012.01) |
| G03F 1/70 | (2012.01) |
| G03F 1/44 | (2012.01) |
| G06F 17/16 | (2006.01) |
| G06F 17/10 | (2006.01) |

(52) U.S. Cl.
CPC ............ *G03F 1/70* (2013.01); *G03F 1/44* (2013.01); *G06F 17/10* (2013.01); *G06F 17/16* (2013.01)

(58) Field of Classification Search
CPC ... G03F 1/70; G03F 1/44; G03F 17/16; G06F 17/10; G06F 17/16
See application file for complete search history.

(56) References Cited

U.S. PATENT DOCUMENTS

| | | | |
|---|---|---|---|
| 6,081,658 A | 6/2000 | Rieger et al. | |
| 6,611,953 B1 * | 8/2003 | Filseth | G03F 1/36 716/54 |
| 6,928,634 B2 * | 8/2005 | Granik | G03F 7/70433 716/52 |
| 6,965,119 B2 * | 11/2005 | Sandstrom | G02B 26/0841 250/216 |
| 7,266,803 B2 * | 9/2007 | Chou | G03F 1/36 716/51 |
| 7,398,508 B2 * | 7/2008 | Shi | G03F 7/705 716/52 |
| 7,480,891 B2 * | 1/2009 | Sezginer | G03F 1/36 716/50 |
| 7,506,300 B2 * | 3/2009 | Sezginer | G03F 1/36 716/50 |

(Continued)

*Primary Examiner* — Naum Levin
(74) *Attorney, Agent, or Firm* — Patterson + Sheridan, LLP

(57) ABSTRACT

Aspects described herein relate to obtaining a mask pattern using a cost function gradient (CFG) generated from a Jacobian matrix generated from a perturbation look-up table (PLT). In an example method, a PLT is populated (108). Each table entry of the PLT is based on a respective perturbed intensity signal. The respective perturbed intensity signal is based on a simulated signal received at an image surface using a mask pattern having a perturbed element of the mask pattern. The mask pattern is for a design of an integrated circuit. A matrix is populated (110) using the PLT and a target intensity signal. The target intensity signal is based on a signal received at the image surface to form target features at the image surface. A CFG is defined (112) based on the matrix. An analysis is performed (114) on the mask pattern based on the CFG.

20 Claims, 5 Drawing Sheets

(56) References Cited

U.S. PATENT DOCUMENTS

| | | | |
|---|---|---|---|
| 7,743,358 B2 * | 6/2010 | Sezginer | G03F 1/36 |
| | | | 716/53 |
| 7,831,954 B2 | 11/2010 | Rieger et al. | |
| 8,032,348 B2 * | 10/2011 | Mitrovic | G06F 30/20 |
| | | | 703/13 |
| 8,331,646 B2 * | 12/2012 | Agarwal | G03F 7/70441 |
| | | | 382/144 |
| 8,478,808 B1 * | 7/2013 | Torunoglu | G06F 17/16 |
| | | | 708/490 |
| 8,812,998 B2 * | 8/2014 | Tao | G06F 30/398 |
| | | | 716/55 |
| 8,918,743 B1 * | 12/2014 | Yan | G03F 7/705 |
| | | | 716/51 |
| 8,941,830 B2 * | 1/2015 | Schmitz | G01N 33/4833 |
| | | | 356/343 |
| 10,310,372 B1 * | 6/2019 | Yenikaya | G03F 1/36 |
| 10,373,349 B2 * | 8/2019 | Koehler | G06T 11/006 |
| 10,430,543 B2 | 10/2019 | Cecil | |
| 10,872,188 B2 * | 12/2020 | Rosenbluth | G06F 30/367 |
| 2004/0019872 A1 * | 1/2004 | Lippincott | G06F 30/39 |
| | | | 716/53 |
| 2009/0225078 A1 * | 9/2009 | Rossignac | G06T 11/203 |
| | | | 345/423 |
| 2017/0242333 A1 | 8/2017 | Li et al. | |

\* cited by examiner

OBTAINING A MASK USING A COST FUNCTION GRADIENT FROM A JACOBIAN MATRIX GENERATED FROM A PERTURBATION LOOK-UP TABLE

CROSS-REFERENCE TO RELATED APPLICATIONS

This application claims priority to and the benefit of U.S. Provisional Patent Application Ser. No. 62/865,481, entitled "ILT Gradient Computation from the Jacobian Matrix," filed Jun. 24, 2019, which is incorporated herein by reference in its entirety.

TECHNICAL FIELD

The present disclosure relates to obtaining a mask pattern of a mask for a design of an integrated circuit.

BACKGROUND

In the area of mask synthesis and optimization, two leading technology tools have been used to assist in the iterative mask optimization portion of the flow: Perturbation Lookup Tables/functions (PLT) and Cost Function Gradients (CFG). PLTs are used to quickly compute the impact of a mask edge perturbation on a simulated wafer. A CFG can compute the gradient of a lithography cost function with respect to all the mask edges in the layout. This gradient gives the optimization direction for all the edges. Previously, PLTs allow for the fast creation of a signal response Jacobian matrix with entries that are a derivative of an intensity signal with respect to a change in a mask edge, which can be used to optimize the mask by computing its pseudo-inverse.

A gradient can be used when level set functions are used to represent the mask, which is called Inverse Lithography Technology (ILT). This can be extended to cost function gradients for non-level set mask representations. The cost function gradient can be used to power many different variants of gradient descent optimization for mask synthesis application. ILT is able to achieve the best lithographic quality of all current mask synthesis solutions in the market.

SUMMARY

An example is a method. A perturbation look-up table is populated. Each table entry of the perturbation look-up table is based on a respective perturbed intensity signal. The respective perturbed intensity signal is based on a simulated signal received at an image surface using a mask pattern having a perturbed element of the mask pattern. The mask pattern is for a design of an integrated circuit. A matrix is populated, by one or more processors, using the perturbation look-up table and a target intensity signal. The target intensity signal is based on a signal received at the image surface to form target features at the image surface. A cost function gradient is defined based on the matrix. An analysis is performed on the mask pattern based on the cost function gradient.

In the above example method, each table entry of the perturbation look-up table may further be based on an original simulated intensity signal. The original simulated intensity signal may be based on a simulated signal received at the image surface using the mask pattern without having a perturbed element. Further, in the above example method, each matrix entry of the matrix may be based on a difference between (i) a magnitude difference between (a) a table entry of the perturbation look-up table corresponding to a respective mask element and a respective perturbation amount and (b) the target intensity signal, and (ii) a magnitude difference between (a) a table entry of the perturbation look-up table corresponding to the respective mask element and a negative of the respective perturbation amount and (b) the target intensity signal.

In the above example method, each matrix entry of the matrix may be based on a discrete finite difference calculation based on one or more function PLT function calls to the perturbation look-up table.

In the above example method, each matrix entry of the matrix may further be based on an original simulated intensity signal, and the original simulated intensity signal may be based on a simulated signal received at the image surface using the mask pattern without having a perturbed element.

In the above example method, each matrix entry of the matrix may be based on a corresponding table entry of the perturbation look-up table that is based on a given evaluation point and a given perturbed edge of a polygon of the mask pattern being perturbed by a given perturbation amount.

In the above example method, the matrix may have a number of columns and a number of rows; the number of columns may correspond to a number of perturbed elements that are perturbed for the perturbed intensity signals; the number of rows may correspond to a number of evaluation points in a set of evaluation points in the image surface; for each column of the matrix, matrix entries in the respective column may correspond to a same perturbed element of the mask pattern; and for each row of the matrix, matrix entries in the respective row may correspond to a same evaluation point.

In the above example method, each matrix entry of the matrix may be based on a difference between (i) a magnitude difference between (a) a combination of an original simulated intensity signal and a table entry of the perturbation look-up table corresponding to a respective mask element and a respective perturbation amount and (b) the target intensity signal, and (ii) a magnitude difference between (a) a combination of the original simulated intensity signal and a table entry of the perturbation look-up table corresponding to the respective mask element and a negative of the respective perturbation amount and (b) the target intensity signal, wherein the original simulated intensity signal is based on a simulated signal received at the image surface using the mask pattern without having a perturbed element.

In the above example method, the cost function gradient may include a vector; each vector entry of the vector may correspond to a respective perturbed element of the mask pattern; and each vector entry of the vector may include a sum of matrix entries of the matrix that correspond to the respective perturbed element that corresponds with the respective vector entry.

In the above example method, the analysis may be an optimization analysis, and the optimization analysis may be configured to move edges of polygons of the mask pattern to optimize the mask pattern.

Another example is a system. The system includes a memory storing instructions and one or more processors, coupled with the memory and configured to execute the instructions. The instructions, when executed by the one or more processors, cause the one or more processors to: obtain a perturbation look-up table related to a mask pattern of a mask for a design of an integrated circuit, populate a matrix, define a cost function gradient including a vector, and perform an optimization analysis on the mask pattern using the cost function gradient. Each table entry of the perturbation look-up table corresponds to a respective perturbed mask element of the mask pattern. Each table entry of the perturbation look-up table is based on a respective perturbed intensity signal. The respective perturbed intensity signal is based on a simulated signal received at an image surface using the mask pattern having the respective perturbed mask element that corresponds to the respective table entry perturbed a perturbation amount. Each matrix entry of the matrix corresponds to a respective evaluation point and a respective perturbed mask element of the mask pattern. Each matrix entry of the matrix is based on (i) a respective table entry of the perturbation look-up table corresponding to the respective perturbed mask element that corresponds to the respective matrix entry and at the respective evaluation point that corresponds to the respective matrix entry, and (ii) a target intensity signal at the respective evaluation point that corresponds to the respective matrix entry. The target intensity signal is based on a signal received at the image surface to form target features at the image surface. Each vector entry of the vector corresponds to a respective perturbed mask element. Each vector entry of the vector is based on each matrix entry of the matrix that corresponds to the respective perturbed mask element that corresponds to the respective vector entry.

In the above example system, each table entry of the perturbation look-up table may be based on the respective perturbed intensity signal combined with an original simulated intensity signal, and the original simulated intensity signal may be based on a simulated signal received at the image surface using the mask pattern without having a perturbed mask element.

Further, in the above example system, each matrix entry of the matrix may be based on a difference between (i) a magnitude difference between (a) the respective table entry of the perturbation look-up table corresponding to the respective perturbed mask element and a respective perturbation amount and at the respective evaluation point and (b) the target intensity signal at the respective evaluation point, and (ii) a magnitude difference between (a) a respective table entry of the perturbation look-up table corresponding to the respective perturbed mask element and a negative of the respective perturbation amount and at the respective evaluation point and (b) the target intensity signal at the respective evaluation point.

In the above example system, each matrix entry of the matrix may be based on a difference between (i) a magnitude difference between (a) a first combination of an original simulated intensity signal and the respective table entry of the perturbation look-up table corresponding to the respective perturbed mask element and a respective perturbation amount where the first combination is at the respective evaluation point and (b) the target intensity signal at the respective evaluation point, and (ii) a magnitude difference between (a) a second combination of the original simulated intensity signal and a respective table entry of the perturbation look-up table corresponding to the respective perturbed mask element and a negative of the respective perturbation amount where the second combination is at the respective evaluation point and (b) the target intensity signal at the respective evaluation point, wherein the original simulated intensity signal is based on a simulated signal received at the image surface using the mask pattern without having a perturbed mask element.

In the above example system, each vector entry of the vector may be based on a sum of each matrix entry of the matrix that corresponds to the respective perturbed mask element that corresponds to the respective vector entry.

Another example is a method. A Jacobian matrix is populated, by one or more processors, using table entries of a perturbation look-up table. A cost function gradient is defined based on the Jacobian matrix. An optimization analysis is performed on the mask pattern based on the cost function gradient. Each matrix entry of the Jacobian matrix corresponds to a respective evaluation point in an image surface and a respective perturbed element of a mask pattern. Each matrix entry of the Jacobian matrix is indicative of a rate of change, with respect to a change of the respective perturbed element of the respective matrix entry, of a magnitude of a difference between an original simulated intensity signal and a target intensity signal at the respective evaluation point of the respective matrix entry. The mask pattern is for a design of an integrated circuit. The original simulated intensity signal is a simulated signal at the image surface using the mask pattern without a perturbed element. The target intensity signal is a signal received at the image surface to form target features at the image surface. Each table entry of the perturbation look-up table corresponds to a respective perturbed element. Each table entry of the perturbation look-up table is based on a change from the original simulated intensity signal as a result of perturbing the respective perturbed element of the respective table entry. The rate of change of the respective matrix entry of the Jacobian matrix is based on a table entry of the perturbation look-up table corresponding to the respective perturbed element of the respective matrix entry and at the respective evaluation point of the respective matrix entry. Each vector entry of the cost function gradient corresponds to a respective perturbed element. Each vector entry of the cost function gradient is based on each matrix entry of the Jacobian matrix that corresponds to the respective perturbed element of the respective vector entry.

In the above example method, the rate of change may be based on a discrete finite difference.

In the above example method, each table entry may be based on a combination of the original simulated intensity signal and the respective change from the original simulated intensity signal; and each matrix entry may be based on a difference between (i) a magnitude of a difference between (a) the respective table entry of the perturbation look-up table corresponding to the respective perturbed element of the respective matrix entry and at the respective evaluation point of the respective matrix entry, and (b) the target intensity signal at the respective evaluation point, and (ii) a magnitude of a difference between (a) another table entry of the perturbation look-up table corresponding to the respective perturbed element and at the respective evaluation point, and (b) the target intensity signal at the respective evaluation point.

In the above example method, each matrix entry may be based on a difference between (i) a magnitude of a difference between (a) a first combination of the original simulated intensity signal and the respective table entry of the perturbation look-up table corresponding to the respective perturbed element of the respective matrix entry where the first combination is at the respective evaluation point of the respective matrix entry, and (b) the target intensity signal at the respective evaluation point, and (ii) a magnitude of a difference between (a) a second combination of the original simulated intensity signal and another table entry of the perturbation look-up table corresponding to the respective perturbed element where the second combination is at the respective evaluation point, and (b) the target intensity signal at the respective evaluation point.

In the above example method, each vector entry of the cost function gradient may be based on a sum of each matrix entry of the Jacobian matrix that corresponds to the respective perturbed element of the respective vector entry.

BRIEF DESCRIPTION OF THE DRAWINGS

The disclosure will be understood more fully from the detailed description given below and from the accompanying figures of examples described herein. The figures are used to provide knowledge and understanding of examples described herein and do not limit the scope of the disclosure to these specific examples. Furthermore, the figures are not necessarily drawn to scale.

DETAILED DESCRIPTION

Figure 1:
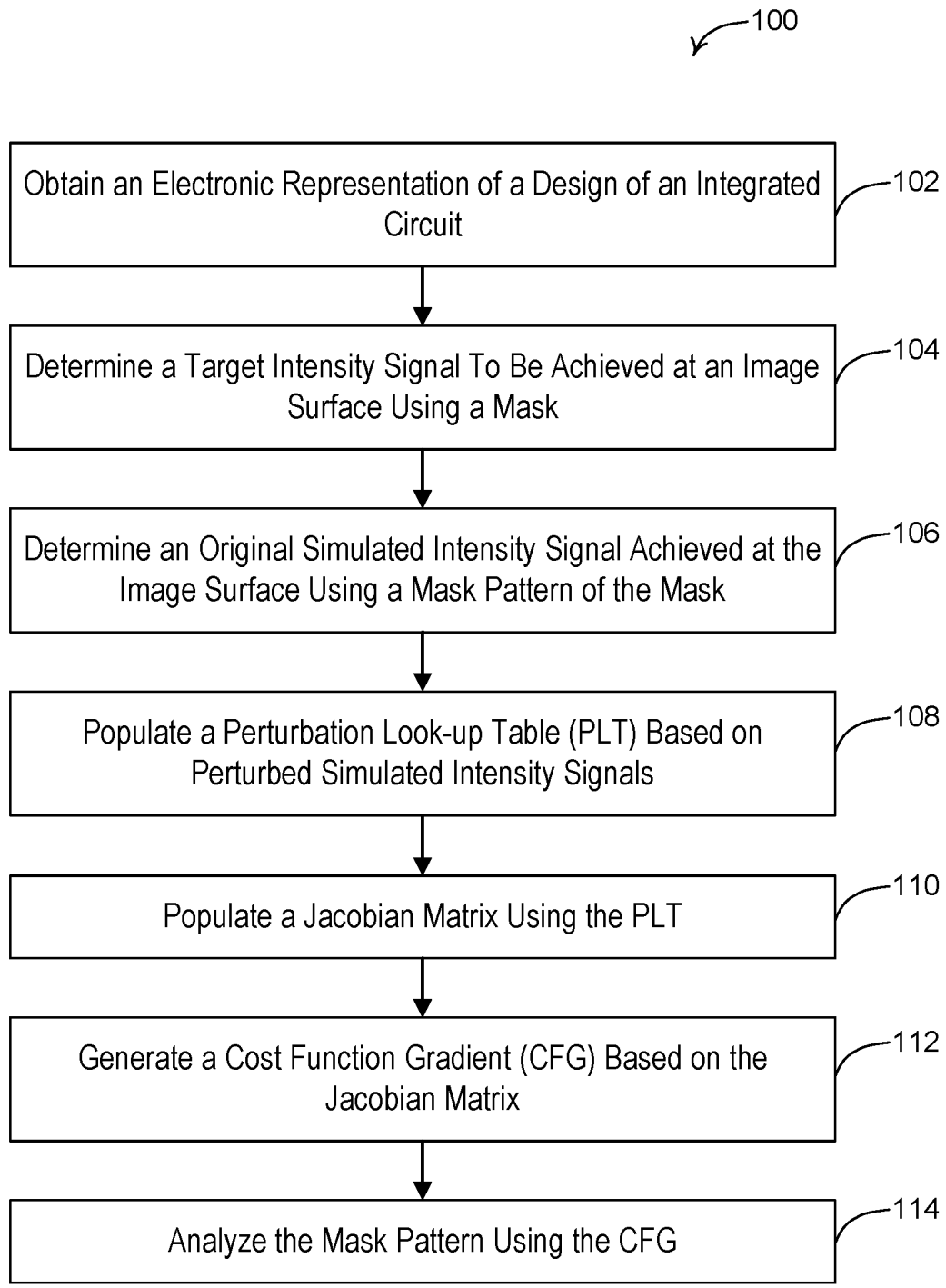
FIG. 1 is a flowchart of a method for lithography-based pattern analysis according to some examples.

Aspects described herein relate to obtaining a mask pattern of a mask for a design of an integrated circuit, and more particularly, obtaining a mask pattern using a cost function gradient (CFG) generated from a Jacobian matrix that is generated from a perturbation look-up table (PLT). In general terms, examples described herein implement a numerical analysis, based on using a PLT and Jacobian matrix derived from a mask pattern for a mask of a design of an integrated circuit, to generate a CFG that approximates the analytical, closed form derivative of a cost function. The CFG, once generated, is used to analyze (such as by an optimization analysis) the mask pattern.

In an analytical form, a cost function $C(M)$ can be expressed as $C(M) = \iint (V_M(x,y) - T(x,y))^2 dxdy$, and a perturbed cost function can be expressed $C(M, m, \varepsilon) = \iint (V_M(m, E)(x,y) - T(x,y))^2 dxdy$. $V_M(x,y)$ is the intensity signal that is achieved at an image surface (e.g., a photosensitive material) resulting from using a given full mask pattern during lithography that has a mask edge m of a set M of mask edges of the mask pattern perturbed (e.g., moved or relocated) by a perturbation amount E, where (x,y) is in the image surface. $T(x,y)$ is a target intensity signal that forms desired features at the image surface. A CFG can then be generated as a vector $$\left( \frac{dC(M)}{dm_1} \quad \cdots \quad \frac{dC(M)}{dm_{N_m}} \right)$$

for $N_m$ number of mask edges $m_i$. The vector entries can be generated for a given mask edge m as $$\frac{dC(M)}{dm} = \lim_{\varepsilon \to 0} \frac{C(M, m, \varepsilon) - C(M)}{\varepsilon}.$$

Examples described herein approximate, numerically and/or programmatically, these analytical, closed form expressions. A PLT is populated based on perturbed simulated intensity signals $\hat{I}_M(m, \varepsilon)(x,y)$. Perturbation of mask edges can be represented by added or subtracted polygons in the mask pattern. A simulation of an added or subtracted polygon can obtain a perturbed simulated intensity signal $\hat{I}_M(m, \varepsilon)(x,y)$ achieved at the image surface based on the added or subtracted polygon that represents perturbing mask edge m of a set M of mask edges by a perturbation amount E. In some examples, entries of the PLT are equal to respective perturbed simulated intensity signals $\hat{I}_M(m,\varepsilon)(x,y)$, e.g., $PLT_P(m_j,\varepsilon)(x,y) = \hat{I}_M(m_j,\varepsilon)(x,y)$. In some examples, entries of the PLT are equal to an original simulated intensity signal $I_M(x,y)$ combined with respective perturbed simulated intensity signals $\hat{I}_M(m, \varepsilon)(x,y)$. The original simulated intensity signal $I_M(x,y)$ is the intensity signal that is achieved at the image surface resulting from using a given mask pattern with no perturbation of any mask edge, where (x,y) is in the image surface. A combination of $I_M(x,y)$ and $\hat{I}_M(m,\varepsilon)(x,y)$ can be by, e.g., addition, etc., and is generally represented herein by $\{I_M + \hat{I}_M(m, \varepsilon)\}(x,y)$. More generically, such a combination can be represented as $\{A+B\}(x,y)$ for signals $A(x,y)$ and $B(x,y)$. Hence, in such examples, $PLT_F(m_j,\varepsilon)(x,y) = \{I_M + \hat{I}_M(m_j,\varepsilon)\}(x,y)$.

A Jacobian matrix is generated based on the PLT and has the form:

$$J = \begin{bmatrix} d_{11} & \cdots & d_{1N_m} \\ \vdots & \ddots & \vdots \\ d_{N_p1} & \cdots & d_{N_pN_m} \end{bmatrix}$$

where $N_p$ is a number of evaluation points $p_i$ in a set P of evaluation points, $p_i \in P$, in the image surface, and $N_m$ is a number mask edges m in a set M of mask edges in the mask pattern. Depending on the PLT, entries $d_{ij}$ of the Jacobian matrix can be as follows:

$$d_{i,j} = \frac{(\{I_M + PLT_P(m_j, \varepsilon)\}(p_i) - T(p_i))^2 - (\{I_M + PLT_P(m_j, -\varepsilon)\}(p_i) - T(p_i))^2}{(2\varepsilon)}$$

$$d_{i,j} = \frac{(PLT_F(m_j, \varepsilon)(p_i) - T(p_i))^2 - (PLT_F(m_j, -\varepsilon)(p_i) - T(p_i))^2}{2\varepsilon}$$

The CFG is then generated having the form $CFG = (v_1, \ldots, v_j, \ldots, v_{N_m})$, where:

$$v_j = \sum_{i=1}^{N_p} d_{ij}$$

The CFG is then used to analyze the mask pattern.

Although described above and below in more specific examples in the context of mask edges, aspects of examples can be applied to any element of a mask pattern in addition to and/or instead of mask edges. For example, other mask elements, such as whole or parts of polygons or other geometric objects, can be perturbed or modified.

Generally, as mask patterns become more complex, such as due to reduction in feature sizes in the design of the integrated circuit and increase of density of the features, performing mask synthesis and optimization using a closed form, analytical approach is becoming increasingly complex, if not infeasible. Modeling the effects of a mask pattern where polygons (e.g., that correspond to features to be formed on a substrate, such as a wafer, or to sub-resolution assist features) in a way that can be analyzed by an analytical approach is becoming increasingly difficult. Hence, even computer systems are not able to accurately synthesize and optimize masks because the model is not accurate. Further, even if the modeling is accurate, an analytical approach may involve numerous simulations for multitudes of permutations of perturbations of mask edges. This can be increasingly resource and time intensive.

Some examples described herein can obviate or mitigate these technical problems. As indicated above, some examples provide an approximation of a closed form, analytical model that is used in a numerical approach. While generally a numerical approach may, in some instances, not provide as accurate of a solution that an analytical approach may otherwise provide, a numerical approach as described herein can be modeled easily and can achieve sufficiently accurate results. Additionally, simulations used in implementing such a numerical approach described herein can be reduced. This reduces the amount of resources and time for mask analysis. Accordingly, some examples described herein can provide a technical solution in that analyzing a mask pattern on, e.g., a computer system can be made simpler and more efficient, which can improve the performance of the computer system by reducing the amount of resources (such as processing and storage) used to analyze the mask pattern.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed subject matter or as a limitation on the scope of the claimed subject matter. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Also, various terms are used herein as used in the art. For example, "optimization", "optimize", and "optimizing" refer, as used in the art and as understood by a person having ordinary skill in the art, to a mathematical formulation of a problem to select some improvement (if an improvement is available), within the structure of the algorithm implemented, of some identified characteristic, and do not imply an absolute or global optimal (as the term is colloquially used) improvement of the characteristic. For example, in some situations where optimizing may determine a minimum, the minimum may be a local minima rather than the global minimum.

FIG. 1 is a flowchart of a method 100 for lithography-based pattern analysis according to some examples. The method 100 is described below in the context of various figures to illustrate aspects. These figures are provided merely as examples, and a person having ordinary skill in the art will readily understand application of the method 100 in other examples.

As described in further detail below, the method 100 can be embodied by one or more sets of instructions, which may be one or more software modules, stored on a non-transitory computer readable medium. One or more processors of a computer system can be configured to read and execute the one or more sets of instructions, which causes the one or more processors to perform the various operations or steps of the method 100. Further details are provided below. In some examples, some operations or steps of the method 100 can be embodied as one or more sets of instructions as one or more software modules, and other operations or steps of the method 100 can be embodied as one or more other sets of instructions as one or more other software modules. The different software modules can be distributed and stored on different non-transitory computer readable media on different computer systems for execution by respective one or more processors of the different computer systems in some examples.

Referring to the method 100 of FIG. 1, at block 102, an electronic representation of a design of an integrated circuit chip to be manufactured on a semiconductor die is obtained. The electronic representation can be in any format, such as including an OASIS file, a GDS file, or the like. In some examples, the design of the integrated circuit includes a mask pattern of a mask that is to be used in lithography for patterning features within the integrated circuit during fabrication. In some examples, the design of the integrated circuit includes features from which a mask pattern is extracted, and in such examples, obtaining the electronic representation at block 102 can further include extracting the mask pattern from the electronic representation. For example, a mask pattern can be extracted by moving edges of features in directions perpendicular to the respective edge by some amount.

A design of an integrated circuit chip can involve a number of masks that are to be used in the fabrication of the integrated circuit. Each mask and corresponding mask pattern, or any number of masks and corresponding mask patterns, can be obtained and analyzed according to methodologies described herein.

The mask pattern for a mask can be represented by polygons in the electronic representation or by polygons extracted from the electronic representation. The polygons can represent respective areas of the mask to be implemented that are opaque to electromagnetic radiation (e.g., visible light, ultra-violet (UV) light, etc.) that is to be implemented in the lithography process in which the mask is used. Depending on whether a photosensitive material (e.g., photoresist) to be used in the lithography is a positive tone or negative tone, the polygons can correspond to areas in which the photosensitive material remains or is removed after exposure. This can result in the mask patterns corresponding to features formed on a semiconductor die or to an inverse of the features formed on the semiconductor die. Example features can include recesses or holes in which metal lines or vias are formed, active areas (e.g., fins) in a substrate, or other features. In more advanced lithography, the mask patterns can correspond to features formed by multiple patterning (e.g., self-aligned double patterning (SADP), self-aligned quadruple patterning (SAQP), lithography-etch-lithograph-etch (LELE), etc.).

At block 104, a target intensity signal to be achieved at an image surface using the mask is determined. The image surface is typically a surface of the photosensitive material to be exposed in the lithography process in which the mask is used during fabrication of the integrated circuit. The target intensity signal corresponds to the dosage of energy received at the image surface that forms desired features in the photosensitive material (such as by causing cross linking in the photosensitive material). The target intensity signal can be based on a function of the photosensitive material that is used in the lithography process, such as a sigmoid function of the response of the photosensitive material to dosage energy. A sigmoid function of the response of the photosensitive material to dosage energy can localize variation of the intensity signal near where a feature is to be formed in the photosensitive material. For purposes of mathematical expression herein, T(x,y) is the target intensity signal at the image surface as a function of a (x,y) point in the image surface.

At block 106, an original simulated intensity signal achieved at the image surface using a mask pattern of the mask is determined. The mask pattern (including the polygons) of the mask obtained from the electronic representation is simulated to obtain the original simulated intensity signal achieved at the image surface. Edges of polygons are unperturbed and are as indicated in or by the electronic representation that was obtained at block 102. The mask pattern has no perturbed mask edge of a polygon of the mask. For purposes of mathematical expression herein, $I_M$(x,y), or generally $I_M$, is the original simulated intensity signal at the image surface as a function of an (x,y) point in the image surface, which is simulated using the mask pattern.

At block 108, a perturbation look-up table (PLT) is populated based on perturbed simulated intensity signals. Each perturbed simulated intensity signal is a simulated signal achieved at the image surface based on a polygon representing a respective perturbed (e.g., moved or relocated) mask edge of the mask pattern of the mask. As will become evident, a PLT leverages the superposition property of the mask pattern, if it is assumed that the simulation is a linear function of the mask shapes, such as convolution. Even if the simulation is nonlinear, the PLTs can be calibrated to simulated test data for a mask perturbation use case and applied as linear perturbations to simulated image results. Any given polygon in the mask pattern can be decomposed to multiple simpler polygons (e.g., rectangles), and a polygon (e.g., a rectangle) can be added or subtracted from any of these simpler polygons to emulate perturbing a corresponding mask edge of the given polygon. The added or subtracted polygon can be simulated to determine a resulting perturbed simulated intensity signal achieved at the image surface based on the added or subtracted polygon. The resulting perturbed simulated intensity signal is therefore a function of a mask edge and a perturbation amount represented by the added or subtracted polygon. A number of resulting perturbed simulated intensity signals can be simulated, where each of the resulting perturbed simulated intensity signals is based on one polygon added or subtracted (and hence, each is a function of a single mask edge and a single perturbation amount).

Figure 2A:
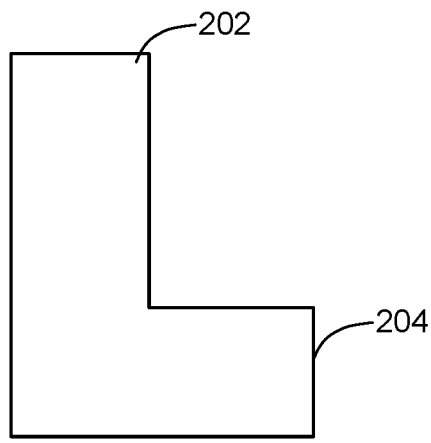
FIGS. 2A-2C depict aspects of perturbing a mask edge and determining a perturbed simulated intensity signal according to some examples.
Figure 2B:
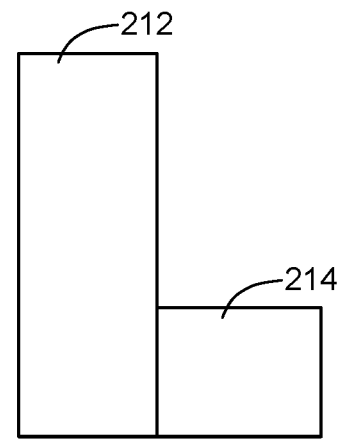
Figure 2C:
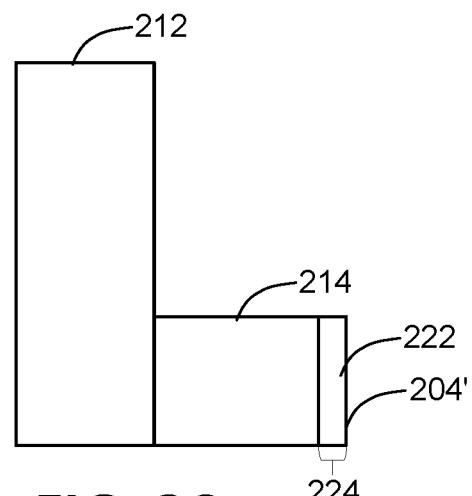

FIGS. 2A-2C depict aspects of perturbing a mask edge and determining a perturbed simulated intensity signal according to some examples. FIG. 2A illustrates an example original polygon 202 from a mask pattern. For purposes of illustration, the original polygon 202 has a mask edge 204. FIG. 2B illustrates the original polygon 202 decomposed into a first rectangle 212 and a second rectangle 214. As can be seen from FIGS. 2A and 2B, the first rectangle 212 and the second rectangle 214 combine (e.g., in a logical union) to result in the shape of the original polygon 202. FIG. 2C shows an added rectangle 222 with a width 224. The added rectangle 222 is added at the edge of the second rectangle 214 that corresponds to the mask edge 204 of the original polygon 202. A simulation is performed on the added rectangle 222 of FIG. 2C to obtain a resulting perturbed simulated intensity signal corresponding to the mask edge 204 being perturbed by a perturbation amount that is equal to the width 224. The resulting perturbed simulated intensity signal is the result of perturbing the mask edge 204 (to a perturbed mask edge 204') by a perturbation amount that is the width 224 of the added rectangle 222. Decomposing polygons and adding or subtracting a polygon, and simulating the added or subtracted polygon, in this manner can simplify computations to simulate a mask pattern that is perturbed in some way.

Referring back to block 108 of FIG. 1, with the resulting perturbed simulated intensity signals determined, respective entries of the PLT are populated based on the perturbed simulated intensity signals. The entries of the PLT, as indicated by the dependency on the perturbed simulated intensity signals, are functions of a mask edge that is perturbed and a perturbation amount that the mask edge is perturbed. In some examples, entries of the PLT are the perturbed simulated intensity signals that correspond to the respective mask edge and perturbation amount of the respective entry of the PLT. In such examples, the entries of the PLT can be perturbed, partial signals that are each a signal to be achieved at the image surface using the added or subtracted polygon representing the respective mask edge perturbed by the respective perturbation amount which can be combined mathematically with the unperturbed signal to construct a full perturbed signal at the image surface. In some examples, entries of the PLT are a combination of the original simulated intensity signal $I_M$(x,y) with the perturbed simulated intensity signals that correspond to the respective mask edge and perturbation amount of the respective entry of the PLT. In such examples, the entries of the PLT can be perturbed, full signals that are each a signal achieved at the image surface using the mask pattern of the mask with the respective mask edge perturbed by the respective perturbation amount.

In examples where the entries of the PLT are combinations of the original simulated intensity signal $I_M$ (x,y) with the perturbed simulated intensity signals, an entry of the PLT can be an addition, convolution, localized weighted average, pointwise non-linear function, activation function, or other mathematical combination of the original simulated intensity signal $I_M$ (x,y) with the respective perturbed simulated intensity signal that determines a signal achieved at the image surface using the mask pattern of the mask with the respective mask edge perturbed by the respective perturbation amount. The original simulated intensity signal and perturbed simulated intensity signals can be rasterized and pixelated signals at the simulated image surface. The mathematical combination of the signals can be based on the pixelated signals.

For ease of mathematical expression, $\hat{I}_M(m_j,\varepsilon)(x,y)$ is a resulting perturbed simulated intensity signal at the image surface resulting from simulation of a polygon representing perturbing mask edge $m_j$ by a perturbation amount $\varepsilon$, and is a function of an (x,y) point in the image surface. PLT($m_j,\varepsilon$)(x,y) is a return of a PLT look-up function that returns the entry of the PLT corresponding to mask edge $m_j$ being perturbed by a perturbation amount $\varepsilon$. In some examples, $PLT_p(m_j,\varepsilon)(x,y)=\hat{I}_M(m_j,\varepsilon)(x,y)$, such as when the entries of the PLT are perturbed, partial signals. In some examples, $PLT_F(m_j,\varepsilon)(x,y)=\{I_m+\hat{I}_M(m_j,\varepsilon)\}(x,y)$, such as when the entries of the PLT are perturbed, full signals. $\{I_M+\hat{I}_M(m_j,\varepsilon)\}(x,y)$ represents a mathematical combination of the original simulated intensity signal $I_M(x,y)$ with the respective perturbed simulated intensity signal $\hat{I}_M(m_j,\varepsilon)(x,y)$. Further, $m_j$ is a mask edge (of index j) of a polygon in a set M of mask edges of polygons of a mask pattern of a mask, $m_j \in M$. $\varepsilon$ is a perturbation amount (which may be a variable or a constant), and a directionality of the perturbation amount may be defined perpendicular to the mask edge being perturbed.

At block 110 of FIG. 1, a Jacobian matrix is populated using the PLT. The Jacobian matrix has $N_p$ number of rows by $N_m$ number of columns, where $N_p$ is a number of evaluation points in the set P of evaluation points, and where $N_m$ is the number of mask edges in the set M of the mask. The Jacobian matrix generally takes the form as follows:

$$J = \begin{bmatrix} d_{11} & \cdots & d_{1N_m} \\ \vdots & \ddots & \vdots \\ d_{N_p1} & \cdots & d_{N_pN_m} \end{bmatrix}$$

Each entry of the Jacobian matrix is theoretically a derivative of a cost function at a given evaluation point with respect to perturbation of a given mask edge, where the cost function is expressed as $C=\iint g(I)(x,y)dxdy$. $g(S)(x,y)$, in examples described herein, is a magnitude difference signal, which is a squared magnitude of the difference between a generic intensity signal S (as a function of point (x,y)) and the target intensity signal T(x,y), $g(S)(x,y)=(S(x,y)-T(x,y))^2$. In other examples, $g(S)(x,y)$ can be any magnitude difference signal, e.g., $g(S)(x,y)=\|S(x,y)-T(x,y)\|$. Matrix entry $d_{ij}$ is theoretically a derivative of the cost function $C(M)=\iint g(I_M)(x,y)dxdy$ at evaluation point $p_i$ with respect to a change in mask edge $m_j$.

The evaluation points can generally be any arbitrary number of points. In some examples, one or more evaluation points are on each edge of a target feature on the image surface, where an edge of a target feature can generally be a threshold intensity dosage to form a desired feature in the image surface. The edge can be defined in the target intensity signal. Further, one or more evaluation points may not be on an edge of a target feature, and such evaluation points may be considered non-targeting signal monitoring points. Such non-targeting signal monitoring points can be used to determine if unwanted features (such as sidelobes) are printed on the image surface.

Figure 3:
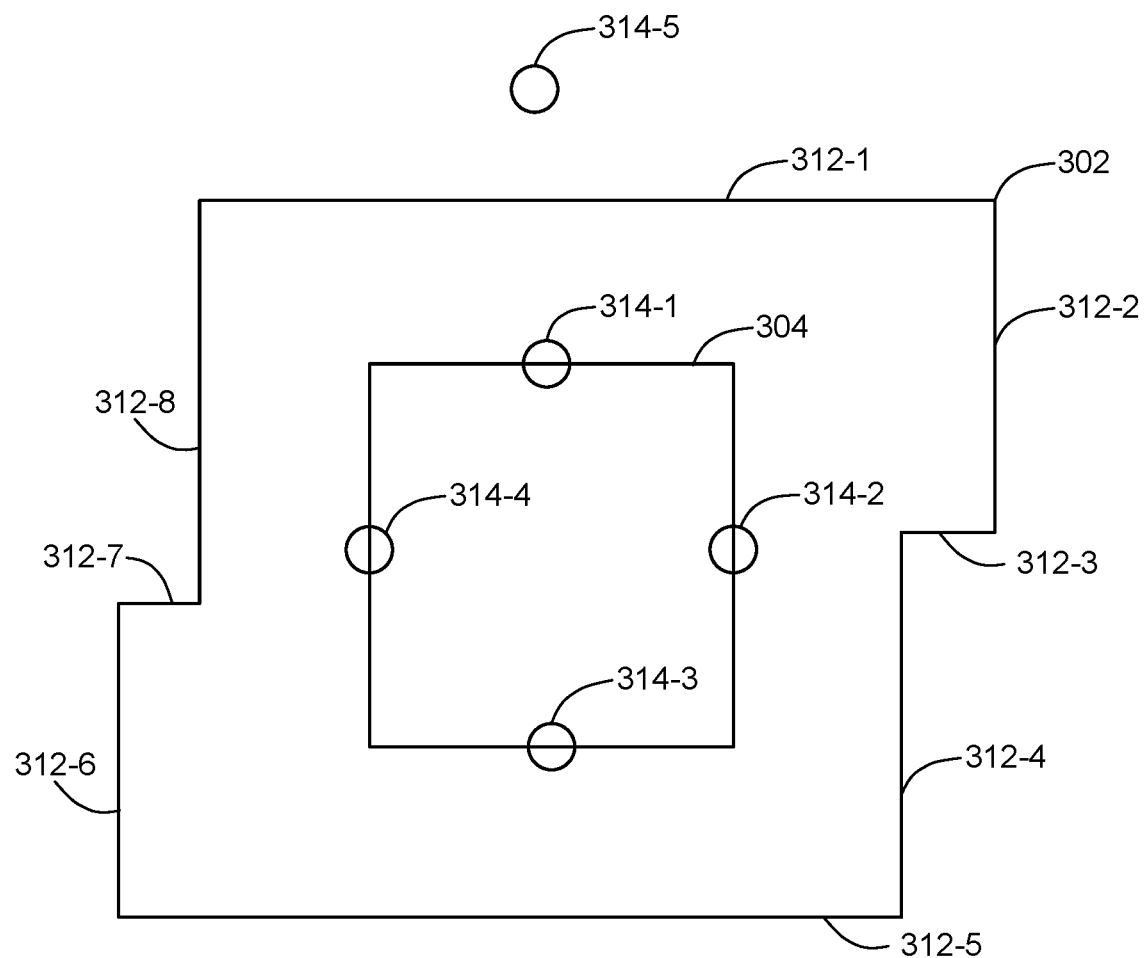
FIG. 3 illustrates aspects of evaluation points according to some examples.

FIG. 3 illustrates aspects of evaluation points according to some examples. FIG. 3 depicts a polygon 302 of a mask pattern and a target feature 304 on an image surface. The polygon 302 and the target feature 304 are overlaid in the illustration. A person having ordinary skill in the art will readily understand that the image surface and mask pattern are separated by some distance, and the overlaying of the polygon 302 and target feature 304 is to illustrate correspondence of edges and points in parallel planes. The polygon 302 has mask edges 312-1, 312-2, 312-3, 312-4, 312-5, 312-6, 312-7, 312-8 (collectively or individually, mask edge(s) 312). Evaluation points 314-1, 314-2, 314-3, 314-4, 314-5 (collectively or individually, evaluation point(s) 314) are also illustrated in FIG. 3. Evaluation points 314-1, 314-2, 314-3, 314-4 are on respective edges of the target feature 304. Each edge of the target feature 304 has one evaluation point 314 thereon, and in other examples, can have multiple evaluation points thereon. Evaluation point 314-5 is not on an edge of the target feature 304 and may be considered a non-targeting signal monitoring point. Any number and/or orientation of evaluation points may be implemented in examples.

According to some examples, the Jacobian matrix is populated using a discrete finite difference calculation based on the PLT. Using a discrete finite difference and the PLT approximates the derivative of the cost function. Each matrix entry is generally indicative of a rate of change, with respect to a change of a corresponding mask edge, of a magnitude difference signal at a corresponding evaluation point.

In some examples when the entries of the PLT are perturbed, partial signals, each matrix entry is generally (i) a difference between (a) a magnitude difference signal that is a function of the original simulated intensity signal combined with a return of a $PLT_P$ function call (e.g., a corresponding entry of the PLT) based on a given mask edge, perturbation amount, and evaluation point, and (b) a magnitude difference signal that is a function of the original simulated intensity signal combined with a return of the $PLT_P$ function call based on the given mask edge, a negative of the perturbation amount, and the evaluation point, which is (ii) divided by two times the given perturbation amount. This can be mathematically expressed as follows:

$$d_{ij} = \frac{g(\{I_M+PLT_P(m_j,\varepsilon)\})(p_i) - g(\{I_M+PLT_P(m_j,-\varepsilon)\})(p_i)}{2\varepsilon}$$

More directly, in these examples, each matrix entry can be generally (i) a difference between (a) a squared magnitude (or other magnitude) of a sum of (I) the original simulated intensity signal combined with a return of a $PLT_P$ function call (e.g., a corresponding entry of the PLT) based on a given mask edge, a perturbation amount, and the evaluation point, and (II) a negative of the target intensity signal at the evaluation point, and (b) a squared magnitude (or other magnitude) of a sum of (I) the original simulated intensity signal combined with a return of a $PLT_P$ function call based on the given mask edge, a negative of the perturbation amount, and the evaluation point, and (II) a negative of the target intensity signal at the evaluation point, which is (ii) divided by two times the perturbation amount. This can be mathematically expressed as follows:

$$d_{ij} = \frac{(\{I_M+PLT_P(m_j,\varepsilon)\}(p_i)-T(p_i))^2 - (\{I_M+PLT_P(m_j,-\varepsilon)\}(p_i)-T(p_i))^2}{(2\varepsilon)}$$

As described above, the combination of the original simulated intensity signal and a return of the $PLT_P$ function call can be by using addition, convolution, localized weighted average, pointwise non-linear function, activation function, or other mathematical combination.

In some examples when the entries of the PLT are perturbed, full signals, each matrix entry is generally (i) a difference between (a) a magnitude difference signal that is a function of a return of a $PLT_F$ function call (e.g., a corresponding entry of the PLT) based on a given mask edge, perturbation amount, and evaluation point, and (b) a magnitude difference signal that is a function of a return of the $PLT_F$ function call based on the given mask edge, a negative of the perturbation amount, and the evaluation point, which is (ii) divided by two times the given perturbation amount. This can be mathematically expressed as follows:

$$d_{i,j} = \frac{g(PLT_F(m_j, \varepsilon))(p_i) - g(PLT_F(m_j, -\varepsilon))(P_i)}{2\varepsilon}$$

More directly, in these examples, each matrix entry can be generally (i) a difference between (a) a squared magnitude (or other magnitude) of a sum of (I) a return of a $PLT_F$ function call (e.g., a corresponding entry of the PLT) based on a given mask edge, a perturbation amount, and an evaluation point, and (II) a negative of the target intensity signal at the evaluation point, and (b) a squared magnitude (or other magnitude) of a sum of (I) a return of a $PLT_F$ function call based on the given mask edge, a negative of the perturbation amount, and the evaluation point, and (II) a negative of the target intensity signal at the evaluation point, and, which is (ii) divided by two times the given perturbation amount. This can be mathematically expressed as follows:

$$d_{i,j} = \frac{(PLT_F(m_j, \varepsilon)(p_i) - T(p_i))^2 - (PLT_F(m_j, -\varepsilon)(p_i) - T(p_i))^2}{2\varepsilon}$$

The Jacobian matrix may, in some instances, have fewer than the $N_p$ number of rows. In such instances, the relevant evaluation points can be identified to populate the Jacobian matrix, which can further simplify operations and calculations.

At block 112, a cost function gradient (CFG) is generated based on the Jacobian matrix. The CFG is generally a vector having vector entries with respect to mask edges of the mask pattern. Theoretically, each vector entry is a derivative of the cost function C with respect to the corresponding mask edge. This theoretical calculation can be expressed as:

$$CFG = \left(\frac{dC}{dm_1}, \dots, \frac{dC}{dm_j}, \dots, \frac{dC}{dm_{N_m}}\right)$$

In examples herein, each vector entry for a given mask edge is calculated as the sum of matrix entries of a respective column of the Jacobian matrix corresponding to the given mask edge. This can be expressed as follows:

$$CFG = (v_1, \dots, v_j, \dots, v_{N_m})$$

where:

$$v_j = \sum_{i=1}^{N_p} d_{i,j}$$

In some examples, the computation of the original simulated intensity signal $I_M(x,y)$ can be performed once prior to the creation of the Jacobian matrix, and each computation for entries of the Jacobian matrix based on the original simulated intensity signal $I_M(x,y)$ and/or a return of the function call $PLT(m_j,\varepsilon)(p_i)$ can be orders of magnitude faster. This can allow for the full Jacobian matrix to be computed much faster than if a PLT was not available and a full resulting perturbed simulated intensity signal based on an entire mask pattern having a perturbed mask edge was resimulated for each entry.

At block 114, the mask pattern undergoes an analysis using the CFG. The analysis can be an optimization analysis, and further, the optimization analysis can be any appropriate gradient-based optimization analysis, such as a gradient descent algorithm. A person having ordinary skill in the art will readily understand appropriate optimization techniques and algorithms, such as techniques and algorithms employed in Inverse Lithography Technology (ILT). The analysis (e.g. optimization analysis) can determine movement or placements of various one or more mask edges of the mask pattern based on the CFG. Any movement can be different from or the same as a perturbation amount used to generate the PLT. The perturbation amount may, in some examples, not be a constraint to the analysis. The analysis can obtain a resulting mask pattern. The resulting mask pattern can be the same mask pattern as the mask pattern that underwent the analysis or may be a different or modified mask pattern. The analysis can, in some instances, not modify placements of mask edges, such as if the original placements achieved a desired result of the analysis. The analysis is configured to move or place mask edges (and obtain a resulting mask pattern) based on the formulation of the analysis. As understood in the art, an optimization analysis may determine a local optimum solution and not necessarily a global or absolute optimum solution.

With the obtained resulting mask pattern, the mask can further be synthesized and/or fabricated into the physical mask used for fabricating the integrated circuit. The physical mask can be used in a lithography process to pattern a photosensitive material as described above.

A person having ordinary skill in the art will readily understand various data structures that may be implemented in the above process. For example, a class of mask objects can be defined for polygons and/or edges of polygons of a mask pattern. Similarly, a database or other storage structure can be implemented to store data of a PLT, Jacobian matrix, and/or CFG. Different data structures and/or modified data structures can be used in different examples.

Additionally, a person having ordinary skill in the art will readily understand various modifications to the logical and/or mathematical expressions of examples described herein. For example, squared magnitudes have been described above, while in other examples, other techniques can implement any form of a magnitude. As another example, different cost functions and/or approximations can be defined and used for calculations. Further, terms such as vector, table, and matrix are generally thought of as mathematical expressions, and related terms, such as column and row, similarly can be organizations within a mathematical expression and can be changed to different organizations. Other examples contemplate such modifications.

Figure 4:
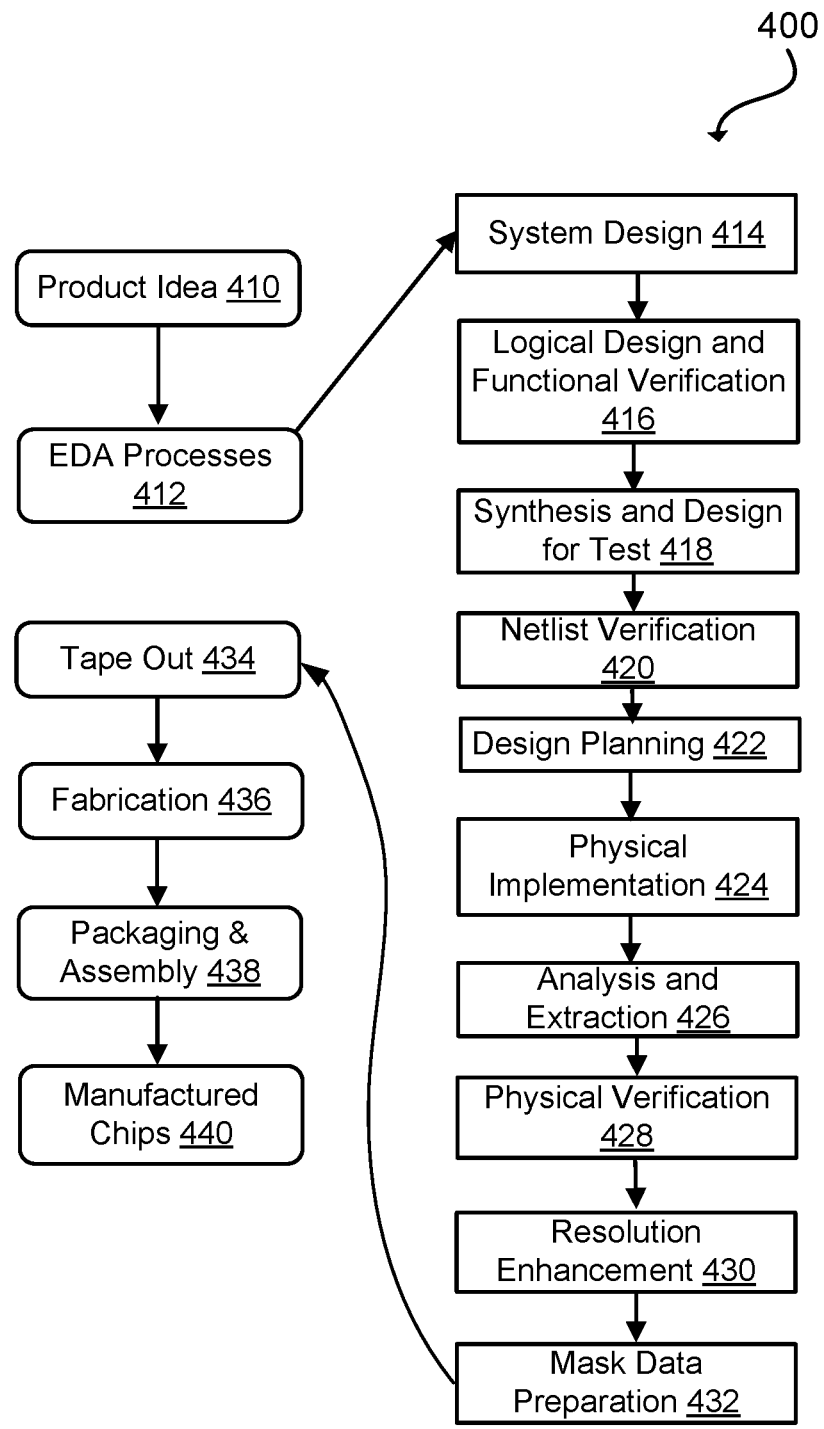
FIG. 4 depicts a flowchart of various processes used during the design and manufacture of an integrated circuit according to some examples.

FIG. 4 illustrates an example set of processes 400 used during the design, verification, and fabrication of an integrated circuit on a semiconductor die to transform and verify design data and instructions that represent the integrated circuit. Each of these processes can be structured and enabled as multiple modules or operations. The term "EDA" signifies Electronic Design Automation. These processes start, at block 410, with the creation of a product idea with information supplied by a designer, information that is transformed to create an integrated circuit that uses a set of EDA processes, at block 412. When the design is finalized, the design is taped-out, at block 434, which is when artwork (e.g., geometric patterns) for the integrated circuit is sent to a fabrication facility to manufacture the mask set, which is then used to manufacture the integrated circuit. After tape-out, at block 436, the integrated circuit is fabricated on a semiconductor die, and at block 438, packaging and assembly processes are performed to produce, at block 440, the finished integrated circuit (oftentimes, also referred to as "chip" or "integrated circuit chip").

Specifications for a circuit or electronic structure may range from low-level transistor material layouts to high-level description languages. A high-level of abstraction may be used to design circuits and systems, using a hardware description language (HDL) such as VHDL, Verilog, SystemVerilog, SystemC, MyHDL or OpenVera. The HDL description can be transformed to a logic-level register transfer level (RTL) description, a gate-level description, a layout-level description, or a mask-level description. Each lower abstraction level that is a less abstract description adds more useful detail into the design description, such as, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 4. The processes described may be enabled by EDA products (or tools).

During system design, at block 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification, at block 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some examples, special systems of components, referred to as emulators or prototyping systems, are used to speed up the functional verification.

During synthesis and design for test, at block 418, HDL code is transformed to a netlist. In some examples, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification, at block 420, the netlist is checked for compliance with timing constraints and for correspondence with the HDL code. During design planning, at block 422, an overall floor plan for the integrated circuit is constructed and analyzed for timing and top-level routing.

During layout or physical implementation, at block 424, physical placement (positioning of circuit components, such as transistors or capacitors) and routing (connection of the circuit components by multiple conductors) occurs, and the selection of cells from a library to enable specific logic functions can be performed. As used herein, the term "cell" may specify a set of transistors, other components, and interconnections that provides a Boolean logic function (e.g., AND, OR, NOT, XOR) or a storage function (such as a flip-flop or latch). As used herein, a circuit "block" may refer to two or more cells. Both a cell and a circuit block can be referred to as a module or component and are enabled as both physical structures and in simulations. Parameters are specified for selected cells (based on standard cells) such as size and made accessible in a database for use by EDA products.

During analysis and extraction, at block 426, the circuit function is verified at the layout level, which permits refinement of the layout design. During physical verification, at block 428, the layout design is checked to ensure that manufacturing constraints are correct, such as design rule check (DRC) constraints, electrical constraints, lithographic constraints, and that circuitry function matches the HDL design specification. During resolution enhancement, at block 430, the geometry of the layout is transformed to improve how the circuit design is manufactured. Resolution enhancement, at block 430 can include the method 100 for lithography-based analysis.

During tape-out, data is created to be used (after lithographic enhancements are applied if appropriate) for production of lithography masks. During mask data preparation, at block 432, the tape-out data is used to produce lithography masks that are used to produce finished integrated circuits.

A storage subsystem of a computer system (such as computer system 500 of FIG. 5) may be used to store the programs and data structures that are used by some or all of the EDA products described herein, and products used for development of cells for the library and for physical and logical design that use the library.

Figure 5:
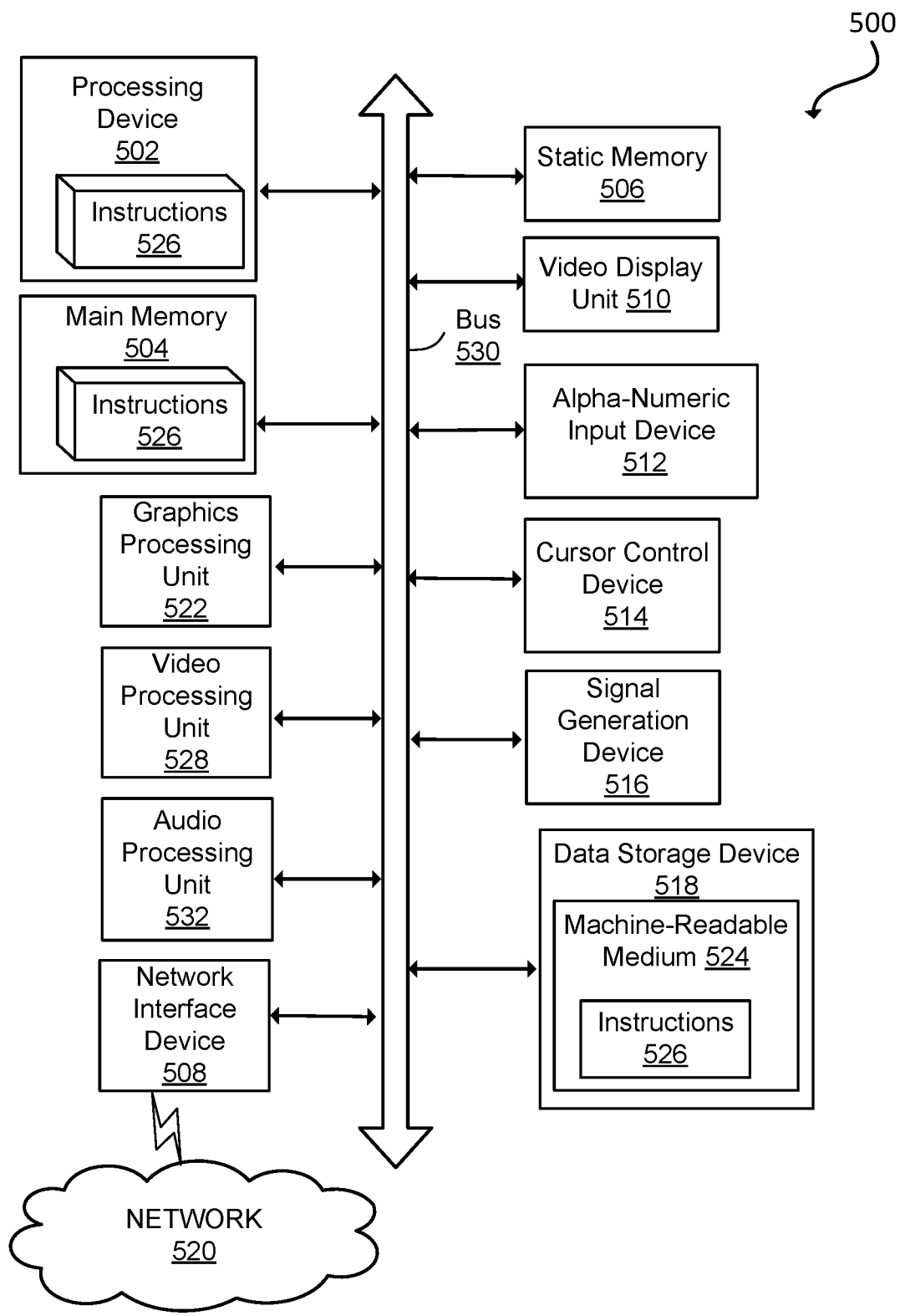
FIG. 5 depicts an abstract diagram of an example computer system in which examples described herein may operate.

FIG. 5 illustrates an example of a computer system 500 within which a set of instructions, for causing the computer system to perform any one or more of the methodologies discussed herein, including the method 100 of FIG. 1 and/or block 430 of FIG. 4, may be executed. In some implementations, the computer system may be connected (e.g., networked) to other machines or computer systems in a local area network (LAN), an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that computer system. Further, while a single computer system is illustrated, the term computer system shall also be taken to include any collection of computer systems that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530. The main memory 504 includes or is a non-transitory computer readable medium. The main memory 504 (e.g., a non-transitory computer readable medium) can store one or more sets of instructions 526, that when executed by the processing device 502, cause the processing device 502 to perform some or all of the operations, steps, methods, and processes described herein, including the method 100 of FIG. 1 and/or block 430 of FIG. 4.

Processing device 502 represents one or more processors such as a microprocessor, a central processing unit, or the like. More particularly, the processing device 502 may be or include complex instruction set computing (CISC) microprocessor, reduced instruction set computing (RISC) microprocessor, very long instruction word (VLIW) microprocessor, a processor implementing other instruction sets, or processor(s) implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing some or all of the operations, steps, methods and processes described herein, including the method 100 of FIG. 1 and/or block 430 of FIG. 4.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (e.g., a non-transitory computer-readable medium) on which is stored one or more sets of instructions 526 or software embodying any one or more of the methodologies or functions described herein, including the method 100 of FIG. 1 and/or block 430 of FIG. 4. The instructions 526 may also reside, completely or at least partially, within the main memory 504 and/or within the processing device 502 during execution thereof by the computer system 500, the main memory 504 and the processing device 502 also including machine-readable storage media.

In some implementations, the instructions 526 include instructions to implement functionality described above. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the computer system and that cause the computer system and the processing device 502 to perform any one or more of the methodologies described above. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
populating a perturbation look-up table, each table entry of the perturbation look-up table being based on a respective perturbed intensity signal, the respective perturbed intensity signal being based on a simulated signal received at an image surface using a mask pattern having a perturbed element formed by adding a polygon to or removing a polygon from the mask pattern, each table entry of the perturbation look-up table is a function of a perturbation amount that the perturbed element is perturbed, the mask pattern being for a design of an integrated circuit;
populating, by one or more processors, a matrix using the perturbation look-up table and a target intensity signal, the target intensity signal being based on a signal received at the image surface to form target features at the image surface;
defining a cost function gradient based on the matrix; and
performing an analysis on the mask pattern based on the cost function gradient.

2. The method of claim 1, wherein each table entry of the perturbation look-up table is further based on an original simulated intensity signal, the original simulated intensity signal being based on a simulated signal received at the image surface using the mask pattern without having a perturbed element.

3. The method of claim 2, wherein each matrix entry of the matrix is based on a difference between (i) a magnitude difference between (a) a table entry of the perturbation look-up table corresponding to a respective mask element and a respective perturbation amount and (b) the target intensity signal, and (ii) a magnitude difference between (a) a table entry of the perturbation look-up table corresponding to the respective mask element and a negative of the respective perturbation amount and (b) the target intensity signal.

4. The method of claim 1, wherein each matrix entry of the matrix is based on a discrete finite difference calculation based on one or more function perturbation look-up table function calls to the perturbation look-up table.

5. The method of claim 1, wherein each matrix entry of the matrix is further based on an original simulated intensity signal, the original simulated intensity signal being based on a simulated signal received at the image surface using the mask pattern without having a perturbed element.

6. The method of claim 1, wherein each matrix entry of the matrix is based on a corresponding table entry of the perturbation look-up table that is based on a given evaluation point and a given perturbed edge of a polygon of the mask pattern being perturbed by a given perturbation amount.

7. The method of claim 1, wherein:
the matrix has a number of columns and a number of rows;
the number of columns corresponds to a number of perturbed elements that are perturbed for the perturbed intensity signals;
the number of rows corresponds to a number of evaluation points in a set of evaluation points in the image surface;
for each column of the matrix, matrix entries in the respective column correspond to a same perturbed element of the mask pattern; and
for each row of the matrix, matrix entries in the respective row correspond to a same evaluation point.

8. The method of claim 1, wherein each matrix entry of the matrix is based on a difference between (i) a magnitude difference between (a) a combination of an original simulated intensity signal and a table entry of the perturbation look-up table corresponding to a respective mask element and a respective perturbation amount and (b) the target intensity signal, and (ii) a magnitude difference between (a) a combination of the original simulated intensity signal and a table entry of the perturbation look-up table corresponding to the respective mask element and a negative of the respective perturbation amount and (b) the target intensity signal, wherein the original simulated intensity signal is based on a simulated signal received at the image surface using the mask pattern without having a perturbed element.

9. The method of claim 1, wherein the cost function gradient includes a vector, each vector entry of the vector corresponding to a respective perturbed element of the mask pattern, each vector entry of the vector including a sum of matrix entries of the matrix that correspond to the respective perturbed element that corresponds with the respective vector entry.

10. The method of claim 1, wherein the analysis is an optimization analysis, the optimization analysis being configured to move edges of polygons of the mask pattern to optimize the mask pattern.

11. A system comprising:
a memory storing instructions; and
one or more processors, coupled with the memory and configured to execute the instructions, wherein the instructions, when executed by the one or more processors, cause the one or more processors to:
obtain a perturbation look-up table related to a mask pattern of a mask for a design of an integrated circuit, each table entry of the perturbation look-up table corresponding to a respective perturbed mask element formed by adding a polygon to or removing a polygon from the mask pattern, each table entry of the perturbation look-up table is a function of a perturbation amount that the respective perturbed mask element is perturbed, each table entry of the perturbation look-up table being based on a respective perturbed intensity signal, wherein the respective perturbed intensity signal is based on a simulated signal received at an image surface using the mask pattern having the respective perturbed mask element that corresponds to the respective table entry perturbed the perturbation amount;
populate a matrix, each matrix entry of the matrix corresponding to a respective evaluation point and a respective perturbed mask element of the mask pattern, each matrix entry of the matrix being based on (i) a respective table entry of the perturbation look-up table corresponding to the respective perturbed mask element that corresponds to the respective matrix entry and at the respective evaluation point that corresponds to the respective matrix entry, and (ii) a target intensity signal at the respective evaluation point that corresponds to the respective matrix entry, wherein the target intensity signal is based on a signal received at the image surface to form target features at the image surface;

define a cost function gradient including a vector, each vector entry of the vector corresponding to a respective perturbed mask element, each vector entry of the vector being based on each matrix entry of the matrix that corresponds to the respective perturbed mask element that corresponds to the respective vector entry; and perform an optimization analysis on the mask pattern using the cost function gradient.

12. The system of claim 11, wherein each table entry of the perturbation look-up table is based on the respective perturbed intensity signal combined with an original simulated intensity signal, the original simulated intensity signal being based on a simulated signal received at the image surface using the mask pattern without having a perturbed mask element.

13. The system of claim 12, wherein each matrix entry of the matrix is based on a difference between (i) a magnitude difference between (a) the respective table entry of the perturbation look-up table corresponding to the respective perturbed mask element and a respective perturbation amount and at the respective evaluation point and (b) the target intensity signal at the respective evaluation point, and (ii) a magnitude difference between (a) a respective table entry of the perturbation look-up table corresponding to the respective perturbed mask element and a negative of the respective perturbation amount and at the respective evaluation point and (b) the target intensity signal at the respective evaluation point.

14. The system of claim 11, wherein each matrix entry of the matrix is based on a difference between (i) a magnitude difference between (a) a first combination of an original simulated intensity signal and the respective table entry of the perturbation look-up table corresponding to the respective perturbed mask element and a respective perturbation amount where the first combination is at the respective evaluation point and (b) the target intensity signal at the respective evaluation point, and (ii) a magnitude difference between (a) a second combination of the original simulated intensity signal and a respective table entry of the perturbation look-up table corresponding to the respective perturbed mask element and a negative of the respective perturbation amount where the second combination is at the respective evaluation point and (b) the target intensity signal at the respective evaluation point, wherein the original simulated intensity signal is based on a simulated signal received at the image surface using the mask pattern without having a perturbed mask element.

15. The system of claim 11, wherein each vector entry of the vector is based on a sum of each matrix entry of the matrix that corresponds to the respective perturbed mask element that corresponds to the respective vector entry.

16. A method comprising:
populating a perturbation look-up table, each table entry of the perturbation look-up table being based on a respective perturbed intensity signal, the respective perturbed intensity signal being based on a simulated signal received at an image surface using a mask pattern having a perturbed element formed by adding a polygon to or removing a polygon from the mask pattern, each table entry of the perturbation look-up table is based on a perturbation amount that the perturbed element is perturbed and an original simulated intensity signal, wherein the mask pattern is for a design of an integrated circuit, and wherein the original simulated intensity signal is based on a simulated signal received at the image surface using the mask pattern without having the perturbed element;

populating, by one or more processors, a matrix using the perturbation look-up table, a target intensity signal, and the original simulated intensity signal, the target intensity signal being based on a signal received at the image surface to form target features at the image surface;

defining a cost function gradient based on the matrix; and performing an analysis on the mask pattern based on the cost function gradient.

17. The method of claim 16, wherein each matrix entry of the matrix is based on a discrete finite difference calculation based on one or more function perturbation look-up table function calls to the perturbation look-up table.

18. The method of claim 16, wherein:
the matrix has a number of columns and a number of rows;
the number of columns corresponds to a number of perturbed elements that are perturbed for the perturbed intensity signals;
the number of rows corresponds to a number of evaluation points in a set of evaluation points in the image surface;
for each column of the matrix, matrix entries in the respective column correspond to a same perturbed element of the mask pattern; and
for each row of the matrix, matrix entries in the respective row correspond to a same evaluation point.

19. The method of claim 16, wherein the cost function gradient includes a vector, each vector entry of the vector corresponding to a respective perturbed element of the mask pattern, each vector entry of the vector including a sum of matrix entries of the matrix that correspond to the respective perturbed element that corresponds with the respective vector entry.

20. The method of claim 16, wherein the analysis is an optimization analysis, the optimization analysis being configured to move edges of polygons of the mask pattern to optimize the mask pattern.

* * * * *